United States Patent
Wirtz, II

(10) Patent No.: US 6,774,668 B1
(45) Date of Patent: Aug. 10, 2004

(54) APPARATUS AND METHOD FOR PREINITIALIZING LOGIC FUNCTION

(75) Inventor: Frank C. Wirtz, II, Corrales, NM (US)

(73) Assignee: Xilinx Inc., San Jose, CA (US)

( * ) Notice: Subject to any disclaimer, the term of this patent is extended or adjusted under 35 U.S.C. 154(b) by 0 days.

(21) Appl. No.: 10/338,431

(22) Filed: Jan. 8, 2003

(51) Int. Cl.$^7$ .............................................. H03K 19/173
(52) U.S. Cl. ...................... 326/37; 326/40; 365/185.01
(58) Field of Search ............................ 326/37, 38, 41, 326/40; 365/185.01, 185.03, 185.04, 188, 206; 327/434; 565/155, 206

(56) References Cited

U.S. PATENT DOCUMENTS

| | | | | |
|---|---|---|---|---|
| 5,128,559 A | * | 7/1992 | Steele ........................ | 326/38 |
| 5,402,014 A | * | 3/1995 | Ziklik et al. .................. | 326/37 |
| 6,038,400 A | * | 3/2000 | Bell et al. ..................... | 710/11 |
| 6,531,887 B2 | * | 3/2003 | Sun et al. ..................... | 326/37 |
| 6,558,967 B1 | * | 5/2003 | Wong ........................... | 438/17 |
| 6,577,534 B2 | * | 6/2003 | Tsuruda ................... | 365/185.09 |

* cited by examiner

Primary Examiner—Michael Tokar
Assistant Examiner—Linh Van Nguyen
(74) Attorney, Agent, or Firm—Scott R. Brown; Edel M. Young; Justin Liu

(57) ABSTRACT

A programmable integrated circuit is disclosed that includes a nonvolatile memory cell programmed to represent a configuration bit associated with a special purpose function. A volatile memory cell is associated with the nonvolatile memory cell. The integrated circuit includes a logic gate for logically combining states of the volatile and nonvolatile memory cells to selectively enable the special purpose function, even before the volatile memory cell is initialized. In this way, the predetermined function can be executed prior to a complete initialization of the integrated circuit.

21 Claims, 3 Drawing Sheets

APPARATUS AND METHOD FOR PREINITIALIZING LOGIC FUNCTION

FIELD OF THE INVENTION

The present invention relates to providing configuration information to an integrated circuit, and more particularly to a method and apparatus for providing configuration information to a selectable function prior to a complete initialization of the integrated circuit.

BACKGROUND

Today's digital logic based electronic systems can have a logic complexity implemented in hardware comparable to the logic employed in software systems developed only a few years ago. Many such systems have achieved this complexity by relying on complex programmable logic devices (CPLD) to perform data processing, manipulation, and control.

Because CPLDs are re-programmable, designers can easily and very inexpensively change their designs. This allows designers to optimize their designs and continue to add new features, thus enhancing their products.

CPLDs offer a high level of integration, including a large number of system gates per unit area, and are available in very small packages. This provides a good solution for designers of products that must fit into small enclosures or that have a limited amount of circuit board space to implement a particular logic design.

CPLDs typically include an array of logic function generators or configurable logic elements, input/output ports, and a matrix of interconnect lines. The matrix of interconnect lines generally surrounds the configurable logic elements and connects logic data signals among the various configurable logic elements and between the configurable logic elements and the input/output ports.

A CPLD is re-programmable because the logical relationship between its inputs and outputs is controlled by configuration information contained in a configuration memory associated with the CPLD. The configuration memory is comprised of memory cells that define an interconnection of logic elements, including connection of outputs of some elements to the inputs of other logical elements. It is advantageous to store such configuration information in nonvolatile memory, such as electrically erasable programmable read only memory (EEPROM), or flash memory, because configuration information stored in nonvolatile memory persists even after electrical power is disconnected from a particular device.

In a conventional CPLD, values of particular EEPROM cells are provided directly to logic components within the CPLD. In order to provide the value of a particular state of a particular EEPROM memory cell, a sense amplifier is required to determine the state of the stored bit of information from within the EEPROM. Unfortunately, the sense amplifiers associated with EEPROM memory consume a significant amount of power when they are enabled. Accordingly, while it is possible to use a purely EEPROM based CPLD, such devices have the serious shortcoming of consuming significant amounts of power, for example as much as 30–40 mA or more at about 2.5 V.

Volatile memory, such as SRAM, can also be used to provide interconnection information to the logic resources associated with a CPLD. For example, SRAM-based CPLDs provide logical configuration information to a CPLD without the sense amplifiers required for use in connection with EEPROMs. In contrast to EEPROMs, SRAM cells consume relatively little power while enabled and operating. Accordingly, reading from SRAM cells consumes relatively little power in comparison to reading from EEPROM cells. To address this power problem and other problems, CPLDS have been designed that employ both volatile and nonvolatile memory. Such CPLDs include the CoolRunner II family of CPLDs available from Xilinx, Inc. of San Jose, Calif. In these CPLDS, configuration information is persistently stored in EEPROM and transferred to SRAM upon initialization of the CPLD. This transfer or initialization process can take from approximately 20 µs to approximately 100 µs, and, in some cases, can take much longer, for example up to 1 second. Once the configuration information has been transferred from the EEPROMs to the SRAMs, the EEPROMs and associated sense amplifiers can be disabled, thereby conserving a significant amount of power.

CPLDs that employ both volatile and nonvolatile memory, however, suffer from the drawback that they do not operate until all of the configuration information has been transferred from the nonvolatile memory to the volatile memory. During this transfer time, some CPLDs place all of the I/O pins into a high impedance state to avoid adverse affects to the system in which the CPLD is operating.

In some CPLD target systems, particularly target systems having multiple system voltages, it can take a significant period of time for the target system to reach an initial stable system-power level. As described above, it takes a significant amount of time for the nonvolatile memory to be transferred to the volatile memory (more than about 20 µs). Furthermore, the CPLD should not begin operation (including nonvolatile to volatile memory transfer) until the CPLD has stable system power and until the target system is otherwise ready for the CPLD to begin operation. Unfortunately, the CPLD cannot use a general purpose I/O pin, for example, to receive a status indication that power is stable and the target system is ready for the CPLD to begin operation if that pin is in a high impedance state. The fact that the CPLD should not begin operation until the target system is ready combined with the fact that the CPLD cannot determine whether the target system is ready without first completing initialization can be characterized as a chicken-and-egg problem.

Accordingly, it would be beneficial to provide, for example, a "hold off" input pin on a CPLD to tell the CPLD to wait for a stable, relatively noise-free system power level before beginning initialization of the SRAM, and thereby solve the chicken-and-egg problem. This could be accomplished using a dedicated pin on a CPLD; however, it would be advantageous to preserve as many I/O pins in a particular package associated with a CPLD for actual use as logical inputs and outputs in system design rather than to waste a pin for a dedicated "hold off" function, for example, that is not needed in a particular application.

Accordingly, there is a need for methods and systems that overcome the problems associated with CPLDs, without requiring dedicated pins.

SUMMARY OF THE INVENTION

A programmable integrated circuit is provided, including one or more nonvolatile memory cells programmed to represent configuration bits associated with a special purpose function or functions. Corresponding volatile memory cells are associated with the nonvolatile memory cells, and in the preferred embodiment, after initialization of the integrated circuit, the volatile memory cells take on the data values stored in the nonvolatile memory cells. The integrated circuit includes a logic gate for logically combining outputs of the volatile and nonvolatile memory cells for selectively enabling the special purpose function or functions, even before the volatile memory cells are initialized. In this way, the predetermined function can be executed prior to a complete initialization of the integrated circuit.

DETAILED DESCRIPTION

In the context of using SRAM in connection with an EEPROM CPLD to reduce power consumption by transferring contents of the EEPROM to the SRAM at initialization and then disabling the EEPROM and associated sense amplifier, methods and apparatus consistent with the present invention provide a useful solution to the chicken-and-egg problem associated with CPLDs that use this shadow memory. Specifically, the present invention provides an enable circuit for a special purpose function that, for example, provides hold-off functionality in a CPLD until the CPLD's target system becomes ready for the CPLD to begin operation.

It will be understood that embodiments of the present invention can be used in connection with integrated circuits other than CPLDS, and that the special purpose function can be chosen from functions other than a hold-off function without departing from the teachings of the present invention. For example, a pass gate function can be substituted for the hold-off function. A pass gate is a logical element that selectively allows a data signal to pass (or not pass) through the gate based on a control signal. For another example, a pin termination assignment function can be the special purpose function. The pin termination assignment function sets the internal termination (such as various pull up, pull down, or high impedance states) to be used for an I/O pin or pins. An advantage of enabling a pin termination assignment function prior to complete initialization of the integrated circuit is that the effect on a signal bus is more benign for hot swap applications.

Further, a data multiplexing or demultiplexing function can be employed. In its simplest form, a multiplexer routes a selected one of a plurality of signals onto a single output. It is understood that complex multiplexers can selectively route a subset of a plurality of signals onto a number of output lines. A demultiplexer performs the inverse operation, in which a signal or set of signals is selectively routed onto a selected subset of a plurality of output signals. Alternatively, an arbitrary combinational or sequential logic function can embody the special purpose function.

Further, in yet another alternative embodiment, CPLD devices consistent with the present invention incorporate configurable data security features that are operable to protect the CPLD logic configuration information from unauthorized reading or inadvertent device erasure or reprogramming. Such a special purpose security function is optionally enabled in connection with the pre-initialization circuitry taught in connection with the present invention. These and other functions may be employed without departing from the scope of the present invention.

Figure 1:
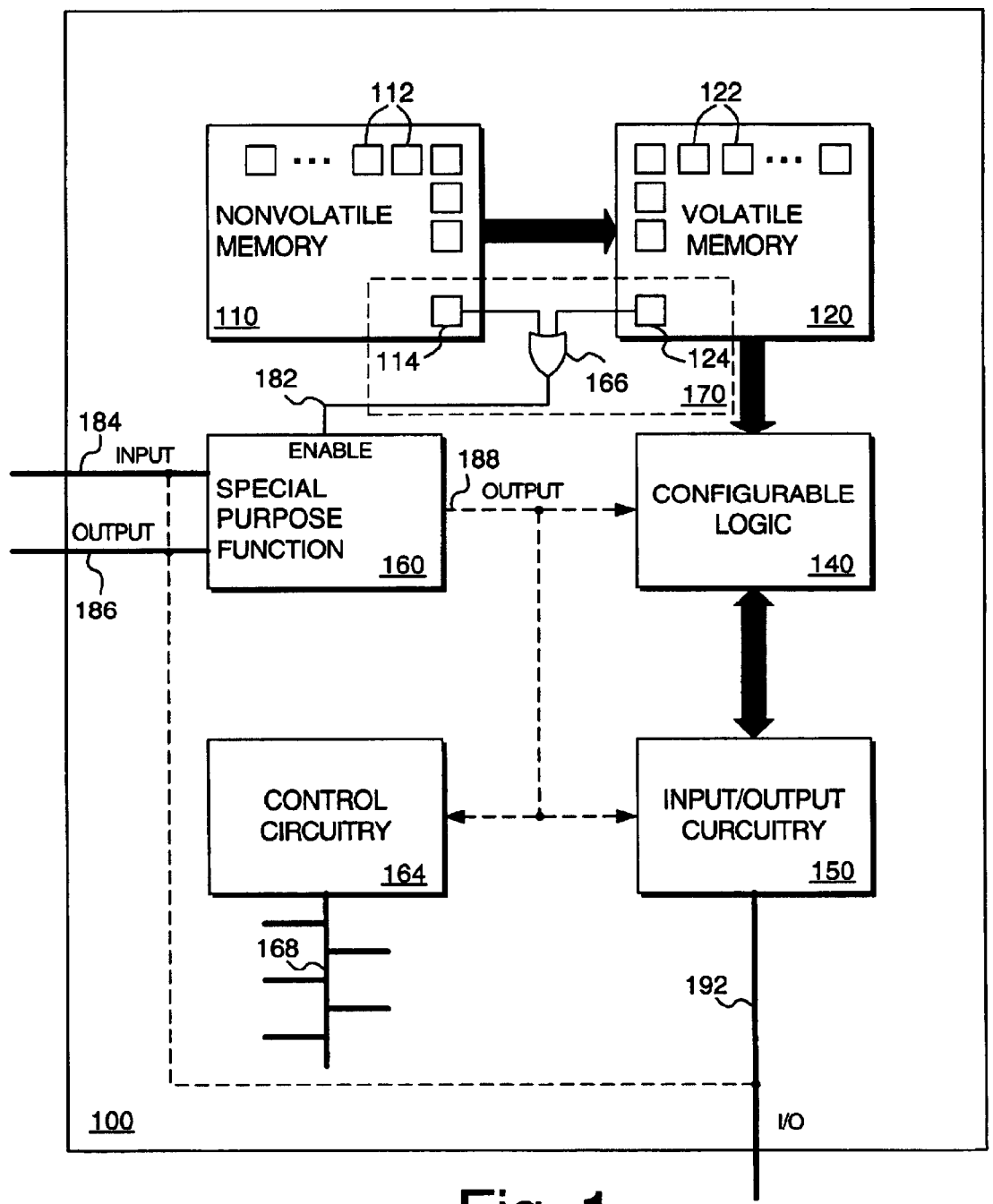
FIG. 1 is a block diagram showing portions of a CPLD consistent with the present invention including an embodiment of a pre-initialization configuration circuit and special purpose function used in connection therewith.
Figure 2:
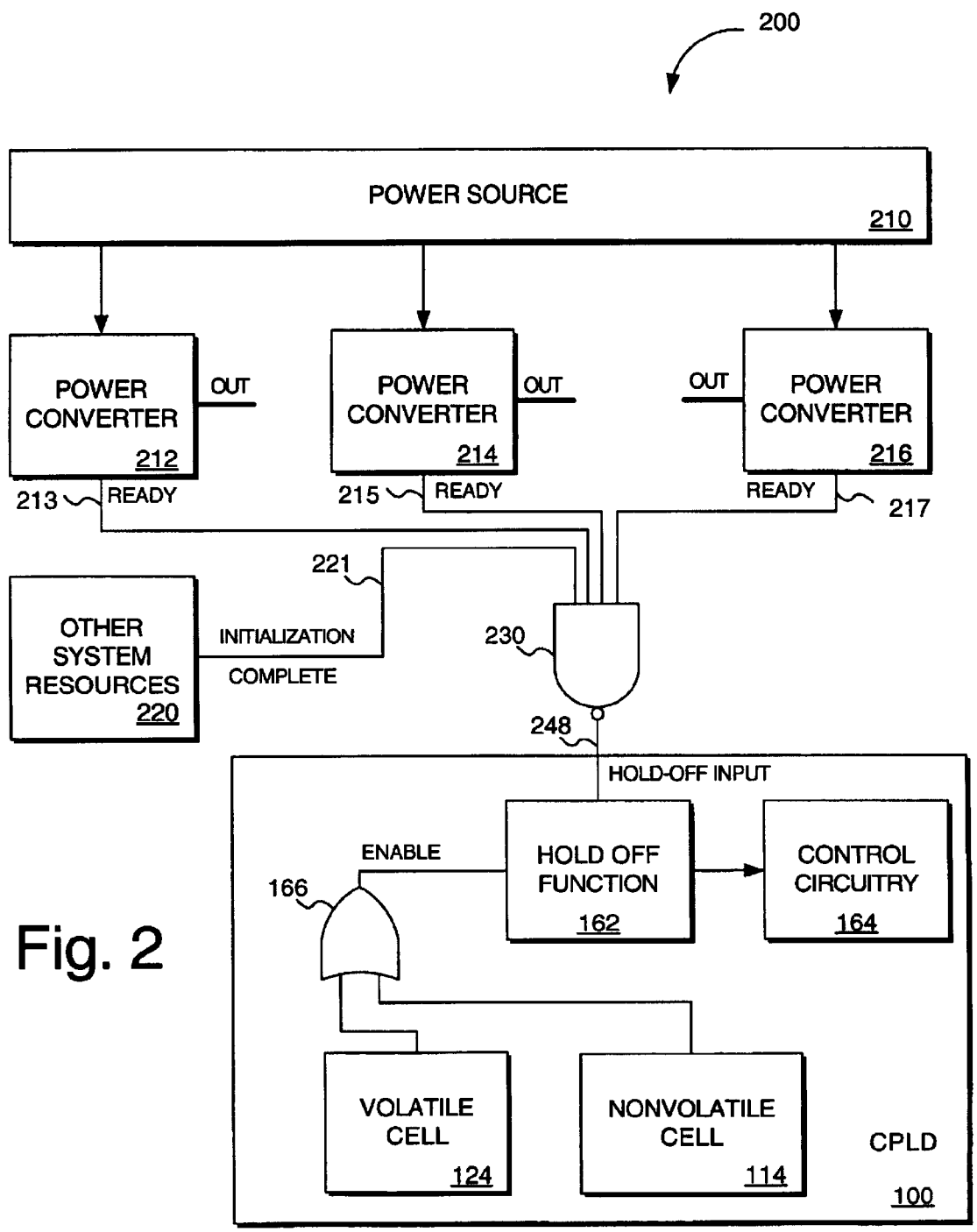
FIG. 2 is an exemplary system showing an embodiment in which the special purpose function is implemented as a hold-off function for the CPLD.

Exemplary embodiments of the present invention relate generally to portions of an integrated circuit, such as CPLD 100 (as shown in FIGS. 1 and 2), that operate in connection with a function, such as special purpose function 160 (FIG. 1) or hold-off function 162 (FIG. 2). The special purpose function 160, for example, can be enabled based on the state of configuration memory cells that selectively causes the special purpose function to be executed prior to initialization.

Referring specifically to FIG. 1, a block diagram is illustrated including portions of CPLD 100, including an embodiment of a pre-initialization configuration circuit 170 and special purpose function 160 used in connection with pre-initialization circuit 170. CPLD 100 includes nonvolatile memory 110, volatile memory 120, configurable logic 140, input/output circuitry 150, and control circuitry 164. It will be understood that nonvolatile memory 110 can be implemented in any number of ways that will be apparent to one of ordinary skill, such as in EEPROM, flash, or other forms of nonvolatile memory. Similarly, volatile memory 120 can be implemented in numerous ways using, for example, various semiconductor fabrication technologies. In one embodiment, nonvolatile memory 110 is a CMOS based EEPROM using floating gate technology and volatile memory is a CMOS based SRAM implemented using cross-coupled inverters.

Nonvolatile memory 110 is comprised of a number of nonvolatile memory cells 112 that, in a preferred embodiment, are arranged in a matrix of rows and columns. Similarly, volatile memory 120 is comprised of volatile memory cells 122 that are also preferably arranged in rows and columns. In one embodiment, nonvolatile memory 110 and volatile memory 120 each have substantially the same number of memory cells.

Consistent with the present invention, at least one of the nonvolatile memory cells 114 and at least one of the volatile memory cells 124 are designated as pre-initialization configuration bits. It will be apparent that any number of pre-initialization configuration bits can be employed without departing from the teachings of the present invention. Also, one or more special purpose functions may be controlled by a single pair (one nonvolatile bit and one volatile bit) of pre-initialization bits. Further, a number of special purpose functions can be employed, such as hold-off, pass gate, pin termination assignment, multiplexing/demultiplexing, and combinational and sequential logic.

In one embodiment, pre-initialization configuration bits 114, 124 are specifically associated with a particular special purpose function, such as special purpose function 160. To accomplish pre-initialization enabling of special purpose function 160, a logic gate 166 is used to combine the states of pre-initialization configuration bits 114, 124 to produce an enable signal 182 that is operable to enable special purpose function 160. In one embodiment, each of the cells of volatile memory 120 takes on an initial state of logic zero when powered up. However, it will be understood that other initial states of volatile configuration memory cells can be used with a corresponding change to logic gate 166 without departing from the teachings of the present invention.

In an embodiment, when CPLD 100 is initially powered up, volatile pre-initialization configuration bit 124 is initially in a state of logic zero, for example by virtue of the design of volatile memory 120 or by an earlier preliminary memory initialization process. Accordingly, since bit 124 is zero and logic gate 166 as shown is implemented as a logical OR gate, the state of nonvolatile pre-initialization configuration bit 114 determines the output state of logic gate 166 and, therefore, the state of special purpose function enable bit 182. As a result, if pre-initialization configuration bit 114 in nonvolatile memory 110 is enabled, special purpose function 160 will be enabled. If bit 114 is not enabled, special purpose function 160 will not be enabled.

Control bus 168 is connected (connections not shown) to various components of the CPLD that are controlled by control circuitry 164. For example, control circuitry 164 facilitates the preferred transferring of information from nonvolatile memory, 110 to volatile memory 120 during initialization of the CPLD.

Special purpose function 160 typically receives external input signals by way of external input pins 184. Optionally, special purpose function 160 can generate external outputs that are asserted on external output pins 186. Although different pins are identified as input and output, special purpose function 160 could also be designed to use a single pin as either input or output depending on design considerations.

Special purpose function 160 can also provide output signals to other parts of the CPLD. For example, the special purpose function can provide signal (or signals) 188 to configurable logic 140 to set the state of a latch within configurable logic 140. The special purpose function can also, optionally, provide information to input/output circuitry 150 and to control circuitry 164 associated with CPLD 100. By way of signal 188, the special purpose function can provide information to control circuitry 164 to delay completion of the initialization of the CPLD, for example.

Input and output pins 184, 186 that are optionally in communication with special purpose function 160 are preferably not dedicated pins. In the preferred embodiment, pins 184 and 186 can be used as general purpose I/O pins 192 that are controlled by configurable logic 140 through input/output circuitry 150. Accordingly, pins 184, 186 are either coupled with special purpose function 160 through input/output circuitry 150, or pins 184, 186 are directly connected both to special purpose function 160 and to input/output circuitry 150. In the latter embodiment, if special purpose function 160 is enabled, input/output circuitry 150 does not drive pins 184, 186. If special purpose function 160 is not enabled, it does not drive the pins 184, 186, so the pins can be used by configurable logic 140, control circuitry 164, or other components in CPLD 100.

FIG. 2 is an exemplary system showing an embodiment in which the special purpose function is implemented as a hold-off function for CPLD 100. In this embodiment, target system 200 is a multivoltage target system board on which 1.8V, 2.5V, and 3.3V power supplies are provided. Power source 210 is, for example, a filtered 12V DC signal that is obtained by reducing and rectifying a line voltage of 115V AC. In the illustrated example, power converter 212 is a 1.8V switching power supply circuit that provides an output of 1.8V and a signal 213 to indicate that the power converter 212 is ready to provide a stable voltage. Similarly, in this example power converters 214 and 216 are 2.5V and 3.3V switching power supply circuits, respectively, having outputs and signals 215 and 217 to indicate that their output voltages are stable upon an initial power-up of the target system.

Additionally, other system resources 220 may have operations that must be completed after an initial power-up before the rest of the board can commence operation. In this example, the ready signals from the power supplies, and an initialization complete signal 221 from other system resources 220 are combined using logic gate 230 to indicate whether certain devices need to hold off before completing their initialization. In this example, logic gate 230 is a logical NAND gate so that it asserts a logical one on the hold-off signal until power converters 212, 214, and 216, and other system resources 220 indicate that they have completed their respective initializations.

Accordingly, in this example, when the hold-off pin 248 changes state from logical one to logical zero, an input to hold-off function 162 detects that the CPLD no longer needs to hold-off completion of its internal initialization, and transfer of information from the nonvolatile memory to the volatile memory can be completed. This can be communicated from hold off function circuitry 162 to control circuitry 164, which controls, for example, the timing of initialization of CPLD 100. Hold-off function circuitry 162 is enabled in connection with enable pin 182, which signal is generated in connection with logic gate 166 based on the outputs of nonvolatile memory cell 114 and volatile memory cell 124. Once CPLD initialization is complete and the configuration information is transferred from the nonvolatile memory to the volatile memory, normal operation of the CPLD commences and the nonvolatile memory, for example an EEPROM, can be turned off to conserve energy. In an embodiment, when the EEPROM is disabled, configuration cell 114 presents a signal that logic gate 166 interprets as a logical zero. Therefore, the information that was transmitted from nonvolatile configuration cell 114 to volatile configuration cell 124 causes enable output 182 of logic gate 166 to be preserved and consistent in its state during pre-initialization periods and after initialization.

Figure 3:
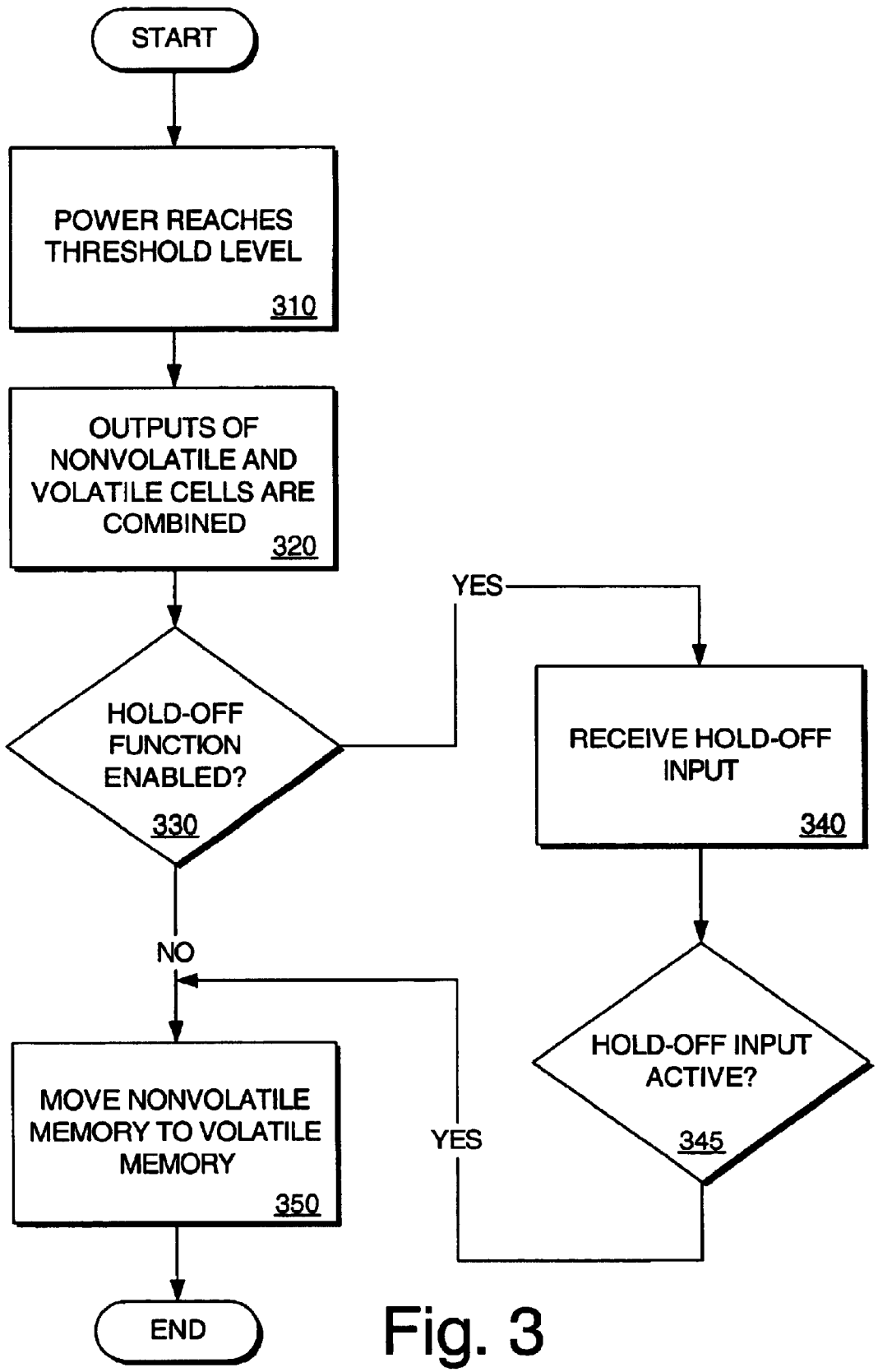
FIG. 3 is a flow diagram showing an exemplary integrated circuit initialization process consistent with the present invention.

FIG. 3 is a flow diagram showing an example of an integrated circuit initialization process consistent with the present invention. As described in connection with FIGS. 1 and 2, a pre-initialization configuration bit in nonvolatile memory 110 of an integrated circuit determines whether an otherwise general purpose I/O pin is to be used in connection with a special purpose function, such as the hold-off function. The initialization process begins when the power reaches a threshold level sufficient to access information in, for example, an BEPROM cell (stage 310). Next, information from a nonvolatile memory configuration cell and from a volatile memory configuration cell are combined, for example, by way of a logic gate such as an OR gate (stage 320). The resulting combined logic results in an enable signal to the hold-off function. If the hold-off function is enabled (stage 330), then, in this exemplary embodiment, a hold-off function input associated with the hold-off function is received (stage 340). Next, it is determined whether the received function input is active (stage 345). When that input is active, then (in the illustrated, exemplary case) initialization can proceed and the contents of the nonvolatile memory can be transferred to the volatile memory (stage 350). Returning to stage 330, if, based on the logical combination of the configuration bits, the hold-off function is not enabled, then the process proceeds on to stage 350 and the initialization process proceeds without executing the hold-off function.

The present invention is described in connection with a CPLD for purposes of illustration only. It will be understood that the teachings of the present invention are similarly applicable to other types of integrated circuits, such as, for example, microprocessors. The act of logical combination of the configuration signals is described in connection with a logical OR gate. However, it is understood that negative logic could be used in connection with a logical NAND gate and that other logical combinations and substitutions can be employed without departing from the teachings of the present invention. The above description of the invention is intended to be illustrative and not limiting. Other embodiments of this invention will be apparent to those skilled in the art in view of the above disclosure.

I claim:

1. A programmable integrated circuit comprising:
   at least one nonvolatile memory cell programmed to represent a configuration bit, the configuration bit associated with at least one function implemented in the integrated circuit;
   at least one volatile memory cell associated with the at least one nonvolatile memory cell; and
   at least one logic gate for logically combining a first output associated with the at least one nonvolatile memory cell with a second output associated with the at least one volatile memory cell resulting in a combined configuration bit, wherein the at least one function is selectively enabled based on the combined configuration bit and wherein the at least one function is operable to be executed prior to a complete initialization of the integrated circuit.

2. The integrated circuit as set forth in claim 1, wherein the first output and the second output take on different logical states.

3. The integrated circuit as set forth in claim 1, wherein the at least one volatile memory cell has a predetermined power-up state.

4. The integrated circuit as set forth in claim 1, wherein the configuration bit is transferred from the at least one nonvolatile memory cell to the at least one volatile memory cell during initialization of the integrated circuit.

5. The integrated circuit as set forth in claim 1, wherein the integrated circuit is a complex programmable logic device.

6. The integrated circuit as set forth in claim 3, wherein the predetermined power-up state is logical zero and the at least one logic gate is a logical OR gate.

7. The integrated circuit as set forth in claim 1, wherein the at least one function implements a hold-off circuit in connection with the integrated circuit, whereby the integrated circuit is inhibited from initializing until a predetermined hold-off signal is received at a hold-off pin associated with the hold-off circuit.

8. The integrated circuit as set forth in claim 1, wherein the at least one function is a pass gate function in connection with the integrated circuit, whereby a particular pass-through signal is selectively transmitted based on a status of a pass-through select input pin.

9. The integrated circuit as set forth in claim 1, wherein the at least one function is a pin termination assignment function in connection with the integrated circuit.

10. The integrated circuit as set forth in claim 1, wherein the at least one function is a multiplexing function in connection with the integrated circuit.

11. The integrated circuit as set forth in claim 1, wherein the at least one function is a sequential logic function in connection with the integrated circuit.

12. The integrated circuit as set forth in claim 1, wherein the at least one function is a combinational logic function in connection with the integrated circuit.

13. The integrated circuit as set forth in claim 1, wherein the at least one function is a security function in connection with the integrated circuit.

14. A method of initializing a programmable integrated circuit, the method comprising:
   programming at least one nonvolatile memory cell to represent a state of a configuration bit, the configuration bit associated with at least one function implemented in the integrated circuit;
   providing to functional circuitry associated with the at least one function, output from at least one logic gate for logically combining a first state associated with the at least one nonvolatile memory cell with a second state associated with at least one volatile memory cell associated with the at least one nonvolatile memory cell resulting in a combined configuration bit, wherein the at least one function is selectively enabled based on the combined configuration bit and wherein the at least one function is operable to be executed prior to a complete initialization of the integrated circuit; and
   transferring information from the at least one nonvolatile memory cell to the volatile memory cell associated with the at least one nonvolatile memory cell.

15. The method as set forth in claim 14, wherein the integrated circuit is a complex programmable logic device.

16. The method as set forth in claim 14, wherein a predetermined power-up state of the at least one volatile memory cell is logical zero and the logic gate is a logical OR gate.

17. The method as set forth in claim 14, further including:
   providing a hold-off circuit in connection with the integrated circuit;
   receiving at a hold-off pin associated with the hold-off circuit, a hold-off signal; and
   based on the hold-off signal, selectively inhibiting the integrated circuit from initializing.

18. An electronic system for use in connection with a programmable integrated circuit, the system comprising:
   means for accessing a stored state of at least one nonvolatile memory cell to represent a state of a configuration bit, the configuration bit associated with at least one function implemented in the integrated circuit;
   means for transferring information from the at least one nonvolatile memory cell to at least one volatile memory cell associated with the at least one nonvolatile memory cell, the at least one volatile memory cell having a predetermined power-up state; and
   means for providing to functional circuitry associated with the at least one function, output from at least one logic gate for logically combining a first state associated with the at least one nonvolatile memory cell with a second state associated with the at least one volatile memory cell resulting in a combined configuration bit state, wherein the at least one function is selectively enabled based on the combined configuration bit state and wherein the at least one function is operable to be executed prior to a complete initialization of the integrated circuit.

19. The system as set forth in claim 18, wherein the integrated circuit is a complex programmable logic device.

20. The system as set forth in claim 18, wherein the predetermined power-up state is logical zero and the at least one logic gate is a logical OR gate.

21. The system as set forth in claim 18, further including;
   a hold-off circuit in connection with the integrated circuit;
   means for receiving at a hold-off pin associated with the hold-off circuit, a hold-off signal; and
   means for selectively inhibiting the integrated circuit from initializing, based on a state of the hold-off signal.

* * * * *